US011476077B2

(12) United States Patent
Baggen et al.

(10) Patent No.: US 11,476,077 B2
(45) Date of Patent: Oct. 18, 2022

(54) INTERFEROMETRIC STAGE POSITIONING APPARATUS

(71) Applicant: ASML Netherlands B.V., Veldhoven (NL)

(72) Inventors: Marcel Koenraad Marie Baggen, Veldhoven (NL); Wouter Onno Pril, Veldhoven (NL); Engelbertus Antonius Fransiscus Van Der Pasch, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 372 days.

(21) Appl. No.: 16/840,297

(22) Filed: Apr. 3, 2020

(65) Prior Publication Data
US 2020/0234911 A1 Jul. 23, 2020

Related U.S. Application Data

(63) Continuation of application No. PCT/EP2018/076571, filed on Oct. 1, 2018.

(30) Foreign Application Priority Data

Oct. 4, 2017 (EP) .................................... 17194665

(51) Int. Cl.
*H01J 37/20* (2006.01)
*H01J 37/24* (2006.01)
(Continued)

(52) U.S. Cl.
CPC ............ *H01J 37/20* (2013.01); *H01J 37/244* (2013.01); *H01J 37/3174* (2013.01);
(Continued)

(58) Field of Classification Search
CPC ...... H01J 37/20; H01J 37/244; H01J 37/3174; H01J 2237/20214; H01J 2237/20235;
(Continued)

(56) References Cited

U.S. PATENT DOCUMENTS 6,020,964 A * 2/2000 Loopstra ............. G03F 7/70716
356/500
6,084,673 A 7/2000 Van Den Brink et al.
(Continued)

FOREIGN PATENT DOCUMENTS

CN 1699914 A 11/2005
JP H 1116967 A 1/1999
(Continued)

OTHER PUBLICATIONS

Notification for Reason(s) for Refusal issued in related Korean Patent Application No. 10-2020-7012683; dated Jan. 12, 2022 (10 pgs.).
(Continued)

*Primary Examiner* — Sean M Luck
(74) *Attorney, Agent, or Firm* — Finnegan, Henderson, Farabow, Garrett & Dunner, LLP

(57) ABSTRACT

A stage apparatus for an e-beam inspection apparatus comprising: an object table (3) comprising an supporting surface, the object table configured to support a substrate (190) on the supporting surface; a positioning device (180) configured to a position the object table; a position measurement system (5) comprising a position sensor (8-10) configured to measure a height position of the object table parallel to a first axis, the first axis being substantially perpendicular to the supporting surface, the position sensor comprising an interferometer measurement system having an interferometer sensor (9, 10, 22), wherein a measurement beam (11, 15) of the interferometer sensor is configured to irradiate a reflec-
(Continued)

tive surface (13, 17) of the object table in a measurement direction, the measurement direction having a first component parallel to the first axis and a second component parallel to a second axis, the second axis being substantially perpendicular to the first axis.

20 Claims, 9 Drawing Sheets

(51) Int. Cl.
*H01J 37/317* (2006.01)
*H01J 37/244* (2006.01)

(52) U.S. Cl.
CPC .......... *H01J 2237/20214* (2013.01); *H01J 2237/20235* (2013.01); *H01J 2237/20292* (2013.01); *H01J 2237/24578* (2013.01)

(58) Field of Classification Search
CPC .. H01J 2237/20292; H01J 2237/24578; G01B 9/02025; G01B 9/02027; G01B 9/02028
See application file for complete search history.

(56) References Cited

U.S. PATENT DOCUMENTS

| | | | | | |
|---|---|---|---|---|---|
| 6,122,036 | A * | 9/2000 | Yamasaki | ............ | G03B 27/42 355/53 |
| 6,208,407 | B1 * | 3/2001 | Loopstra | ............ | G03F 7/7075 356/399 |
| 6,285,444 | B1 * | 9/2001 | Osanai | ............ | G03F 7/70716 355/72 |
| 6,486,955 | B1 * | 11/2002 | Nishi | ............ | G01B 9/02018 356/500 |
| 6,947,148 | B2 * | 9/2005 | Hill | ............ | G01B 11/026 356/498 |
| 7,130,056 | B2 * | 10/2006 | Schluchter | ............ | G03F 7/70775 356/500 |
| 7,352,472 | B2 * | 4/2008 | Krijnen | ............ | G03F 7/70775 356/500 |
| 8,670,127 | B2 * | 3/2014 | Deck | ............ | G01D 5/266 356/486 |
| 8,693,006 | B2 * | 4/2014 | Shibazaki | ............ | G02B 5/08 356/500 |
| 9,200,893 | B2 * | 12/2015 | Holzapfel | ............ | G01D 5/266 |
| 2002/0158185 | A1 | 10/2002 | Nelson et al. | | |
| 2003/0048456 | A1 * | 3/2003 | Hill | ............ | G01B 9/02019 356/500 |
| 2003/0053074 | A1 * | 3/2003 | Hill | ............ | G03F 7/70775 356/500 |
| 2005/0111005 | A1 * | 5/2005 | Eussen | ............ | G01B 9/02018 356/498 |
| 2005/0134816 | A1 | 6/2005 | Modderman et al. | | |
| 2005/0225770 | A1 * | 10/2005 | Chapman | ............ | G03F 7/70775 356/498 |
| 2005/0259268 | A1 | 11/2005 | Schluchter | | |
| 2006/0170892 | A1 | 8/2006 | Koenen et al. | | |
| 2007/0041022 | A1 | 2/2007 | Schluchter | | |
| 2008/0046183 | A1 | 2/2008 | Schoonewelle et al. | | |
| 2008/0062405 | A1 * | 3/2008 | Hill | ............ | G03F 1/78 356/73 |
| 2012/0250030 | A1 * | 10/2012 | de Boer | ............ | G01B 9/02015 356/399 |
| 2013/0020502 | A1 * | 1/2013 | Koya | ............ | B82Y 10/00 250/453.11 |
| 2015/0042969 | A1 | 2/2015 | Morikuni et al. | | |
| 2015/0241200 | A1 * | 8/2015 | Couweleers | ....... | G01B 9/02051 156/60 |

FOREIGN PATENT DOCUMENTS

| | | |
|---|---|---|
| JP | 2005-338075 A | 12/2005 |
| JP | 2012-073250 A | 4/2012 |
| JP | 2013192280 A | 9/2013 |
| JP | 2014-086476 A | 5/2014 |
| TW | 201306076 A1 | 2/2013 |

OTHER PUBLICATIONS

International Search Report and Written Opinion issued in related PCT International Application No. PCT/EP2018/076571, dated Mar. 4, 2019 (17 pgs.).

Notice of Reasons for Rejection issued in related Japanese Patent Application No. 2020-518453; dated Jun. 2, 2021 (6 pgs.).

Office Action of the Intellectual Property Office of Taiwan issued in related Taiwanese Patent Application No. 107134939; dated May 9, 2019 (9 pgs.).

* cited by examiner

INTERFEROMETRIC STAGE POSITIONING APPARATUS

CROSS-REFERENCE TO RELATED APPLICATIONS

This application claims priority of International Application No. PCT/EP2018/076571, filed on Oct. 1, 2018, and published as WO 2019/068601 A1, which claims priority of EP application 17194665.0 which was filed on Oct. 4, 2017. The contents of these applications are incorporated herein by reference in their entireties.

FIELD

The present description relates to a stage positioning device for an electron beam inspection apparatus configured to inspect a specimen such as semiconductor device.

BACKGROUND ART

In the semiconductor processes, defects are inevitably generated. Such defects may impact device performance even up to failure. Device yield may thus be impacted, resulting in cost raise. In order to control semiconductor process yield, defect monitoring is important. One tool useful in defect monitoring is SEM (Scanning Electron Microscope), which scans a target portion of a specimen using one or more beams of electrons.

Accurate positioning of the one or more beams of electrons on the target portion is required to reliably monitor defects. The positioning requirements may need to be further enhanced for monitoring even smaller defects. At the same time, a high throughput is desired which typically requires to increase a velocity of a movement of the specimen, as well as accelerations and decelerations thereof. Also, settling times during which the inspection apparatus may be allowed to settle after a movement of the specimen has stopped, may need to be decreased. All in all, the above may result in an enhancement of requirements on the accuracy and dynamics of the positioning of the specimen.

In a known embodiment of an E-beam inspection tool an optical sensor is used to measure a vertical height position of the substrate supported on the object table at or near the target area of the substrate. This optical sensor is capable of measuring the height position of the substrate at this location with high accuracy. However, the optical sensor has a limited measurement rate of about 130 Hz. This means that the optical sensor is relatively accurate but has a low measurement rate.

With increasing demands on the performance of e-beam inspection tools, the bandwidth of the positioning device is limited by this performance of the optical sensor.

SUMMARY

The present disclosure provides an e-beam inspection tool that allows relatively fast and sufficiently accurate positioning of a substrate supported on the object table with respect to an e-beam source. In particular, it is an object of the invention to provide a position measurement system that allows relatively fast and sufficiently accurate determination of a height position of a substrate supported on the object table.

According to some embodiments of the present disclosure, there is provided a stage apparatus comprising:

an object table comprising an supporting surface, the object table configured to support a substrate on the supporting surface;

a positioning device configured to a position the object table;

a position measurement system comprising a position sensor configured to measure a height position of the object table parallel to a first axis, the first axis being substantially perpendicular to the supporting surface, the position sensor comprising an interferometer measurement system having an interferometer sensor, wherein a measurement beam of the interferometer sensor is configured to irradiate a reflective surface of the object table in a measurement direction, the measurement direction having a first component parallel to the first axis and a second component parallel to a second axis, the second axis being substantially perpendicular to the first axis.

The embodiments of the present disclosure may be embodied by a particle beam apparatus, an e-beam apparatus, an e-beam inspection apparatus, a lithography apparatus, a metrology apparatus, or a vacuum apparatus.

BRIEF DESCRIPTION OF THE DRAWINGS

The embodiments of the present disclosure will be readily understood by the following detailed description in conjunction with the accompanying drawings, wherein like reference numerals designate like structural elements, and in which.

DETAILED DESCRIPTION OF EXAMPLE EMBODIMENTS

Figure 1A:
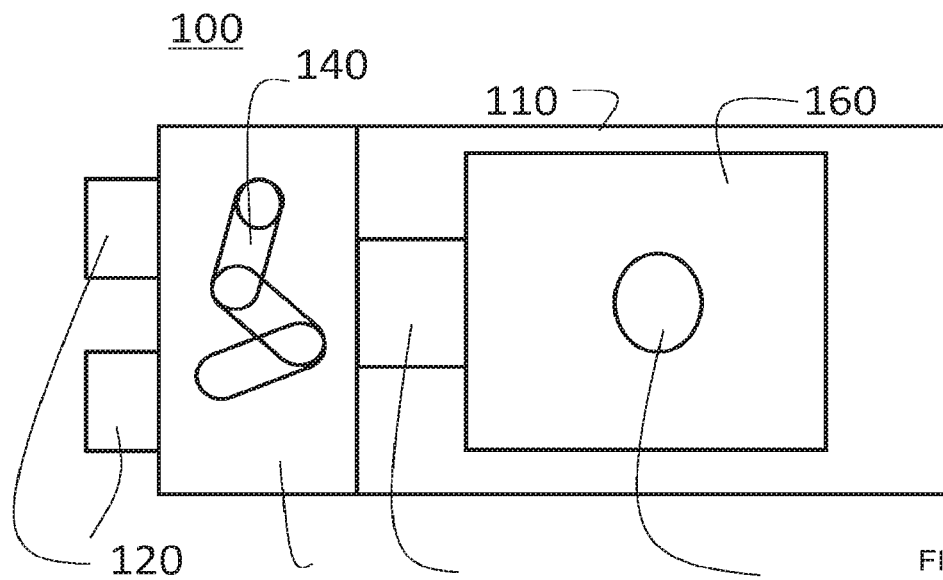
FIGS. 1A and 1B are schematic illustrations of an e-beam inspection tool according to some embodiments of the present disclosure.

Various example embodiments of the present disclosure will now be described more fully with reference to the accompanying drawings in which some example embodiments of the present disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. The embodiments may, however, be embodied in many alternate forms and should not be construed as limited to only the embodiments set forth herein.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may configured and/or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found and/or processed in semiconductor fabrication facilities.

In this disclosure, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The inspection tool according to the present disclosure relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure.

Figure 1B:
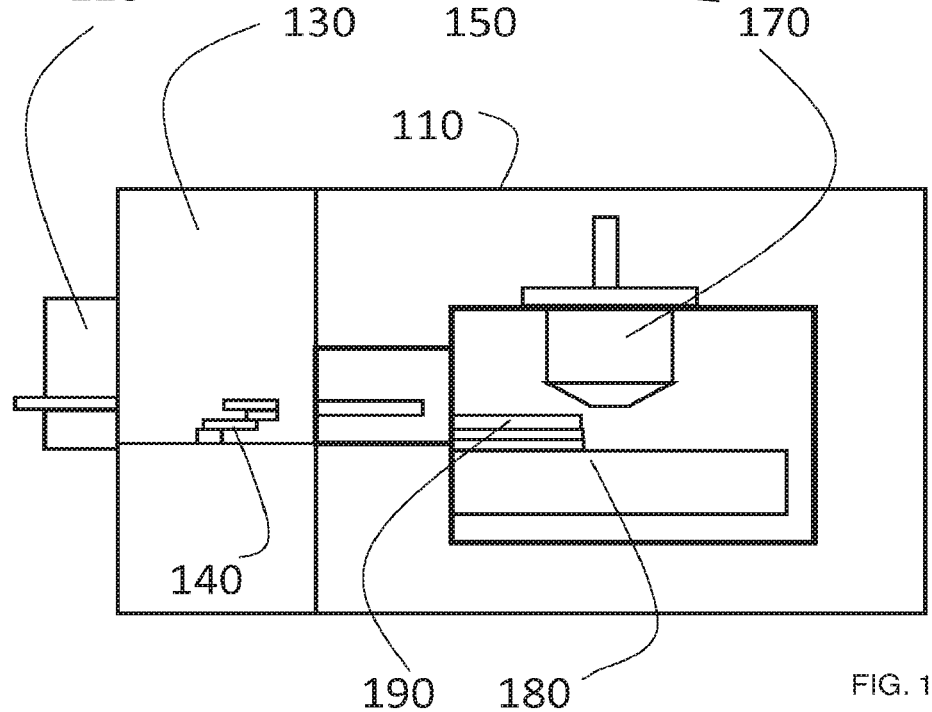

FIGS. 1A and 1B schematically depict a top view and a cross-sectional view of an electron beam (e-beam) inspection (EBI) system 100 according to an embodiment of the present disclosure. The embodiment as shown comprises an enclosure 110, a pair of load ports 120 serving as an interface to receive objects to be examined and to output objects that have been examined. The embodiment as shown further comprises an object transfer system, referred as an EFEM, equipment front end module 130, that is configured to handle and/or transport the objects to and from the load ports. In the embodiment as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the embodiment as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170.

In an embodiment, the positioning device may comprise a cascaded arrangement of multiple positioners such as an XY-stage for positioning the object in a substantially horizontal plane, and a Z-stage for positioning the object in the vertical direction.

In an embodiment, the positioning device may comprise a combination of a coarse positioner, configured to provide a coarse positioning of the object over comparatively large distances and a fine positioner, configured to provide a fine positioning of the object over comparatively small distances.

In an embodiment, the positioning device 180 further comprises an object table for holding the object on a supporting surface during the inspection process performed by the EBI system 100. The supporting surface may be a burl table and/or a clamp. In such embodiment, the object 190 may be clamped onto the supporting surface of the object table by means of a clamp such as an electrostatic clamp. Such a clamp may be integrated in the object table.

In accordance with the present disclosure, the positioning device 180 comprises a first positioner for positioning the object table and a second positioner for positioning the first positioner and the object table.

The positioning device 180 as applied in the present disclosure will be discussed in more detail below.

Figure 2:
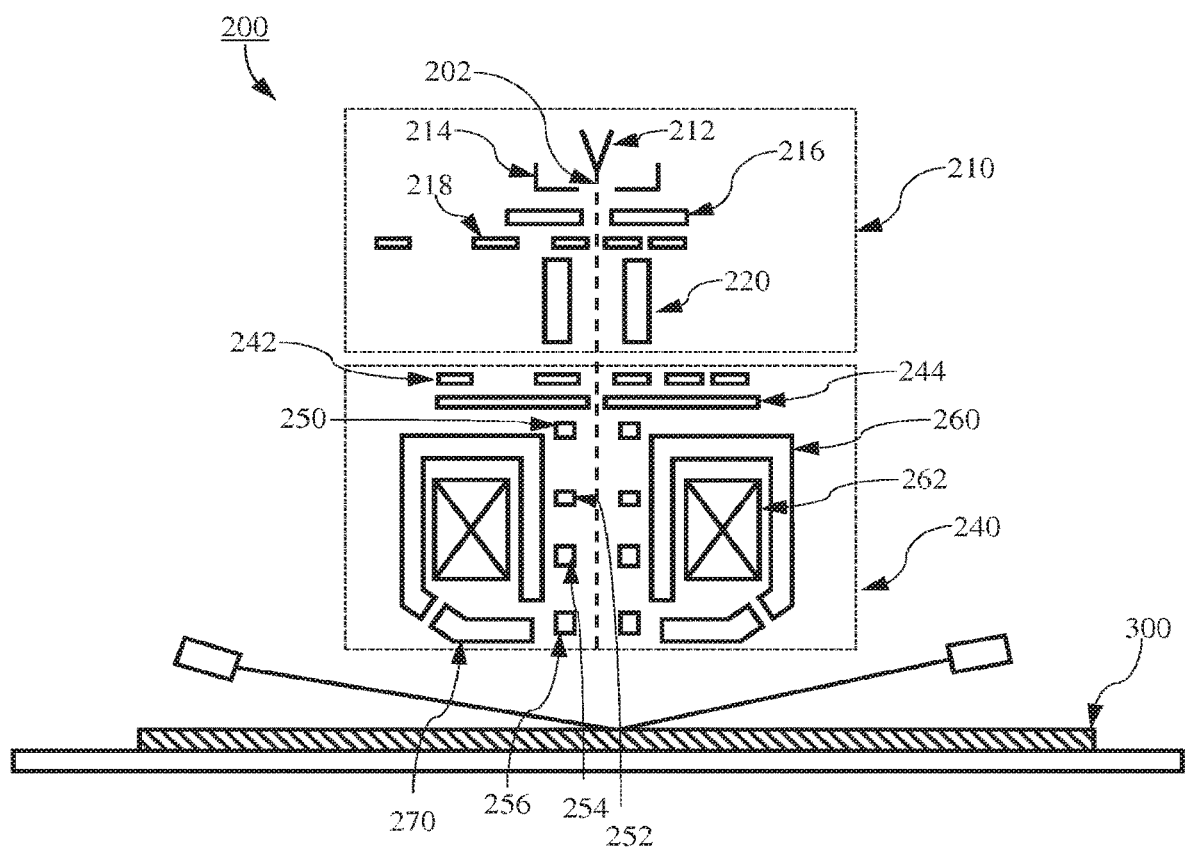
FIGS. 2 and 3 are schematic illustrations an electron optical system as can be applied to some embodiment of the present disclosure.

FIG. 2 schematically depict an embodiment of an electron optics system 200 as can be applied in e-beam inspection tool or system according to some embodiments of the present disclosure. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bent to form a tip for placing the tungsten pin. Next, a ZrO2 is coated on the surface of the tungsten pin, and is heated to 1300° C. so as to be melted and cover the tungsten pin but uncover the pinpoint of the tungsten pin. The melted ZrO2 can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

Figure 3:
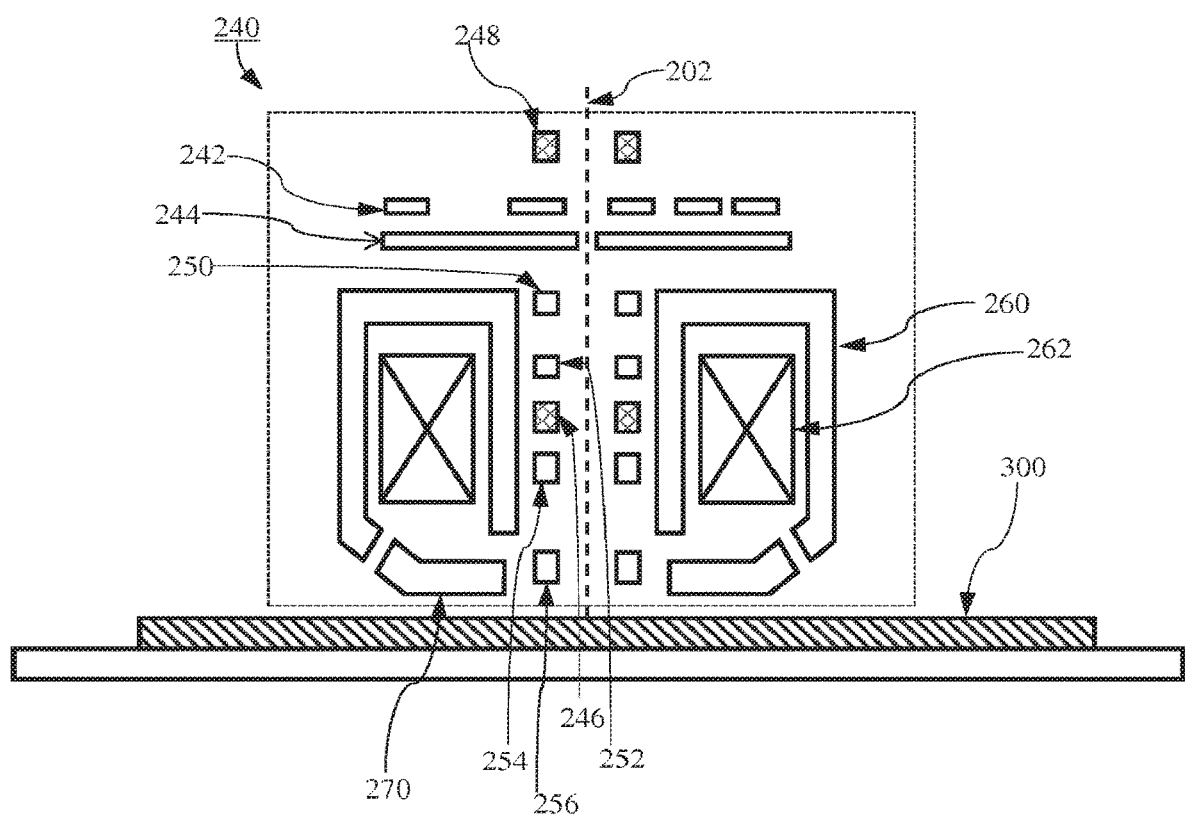

The imaging system 240 as shown in FIG. 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 4:
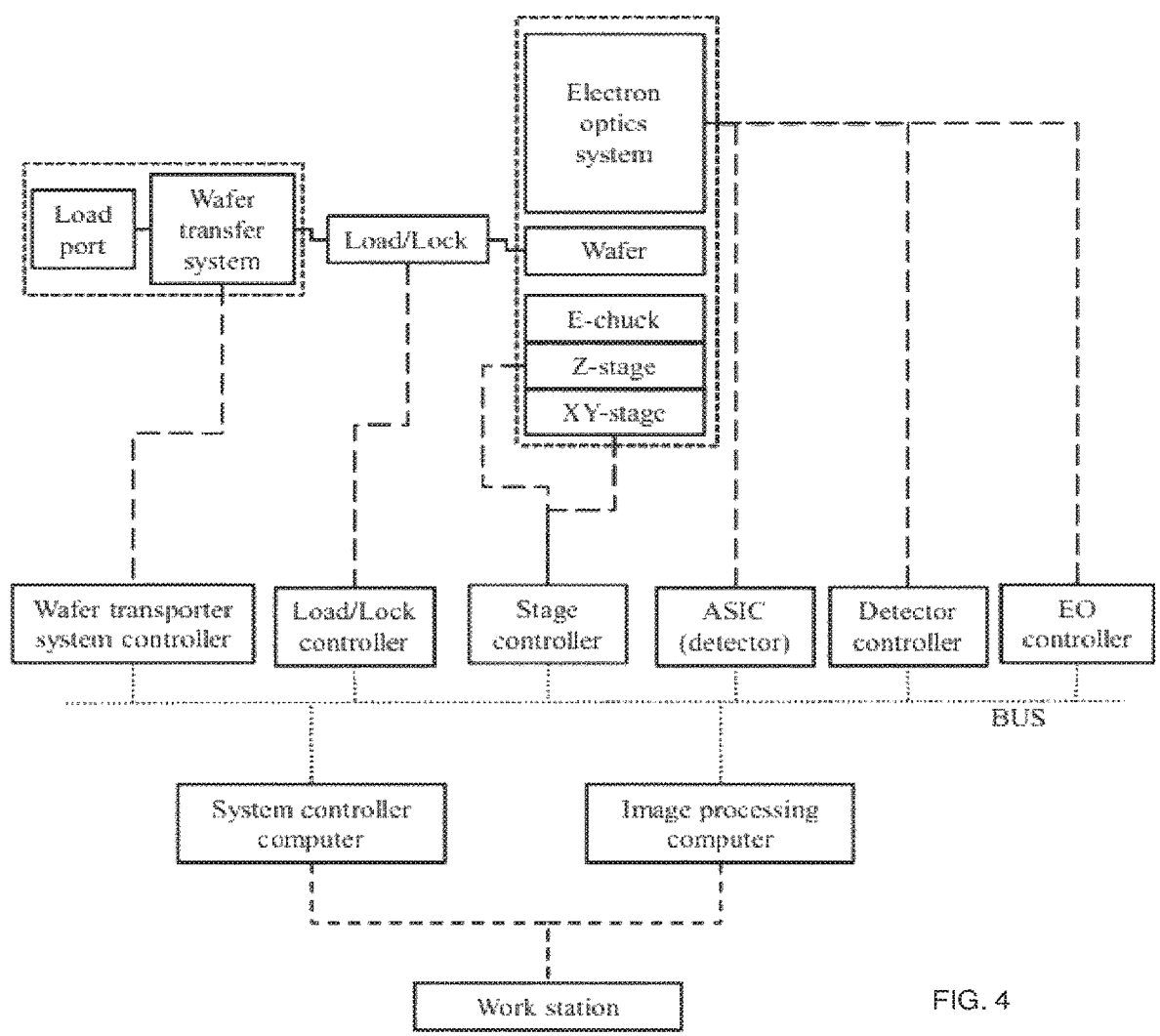
FIG. 4 schematically depicts a possible control architecture of an EBI system according to some embodiments of the present disclosure.

FIG. 4 schematically depicts a possible control architecture of an EBI system according to some embodiments of the present disclosure. As indicated in FIG. 1, the EBI system comprises a load lock, a wafer transfer system, a load/lock, an electron optics system and a positioning device, e.g. including a z-stage and a x-y stage. As illustrated, these various components of the EBI system may be equipped with respective controllers, i.e., a wafer transporter system controller connected to the wafer transfer system, a load/lock controller, an electron optics controller, a detector controller, a stage controller. These controllers may e.g. be communicatively connected to a system controller computer and an image processing computer, e.g. via a communication bus. In the embodiment as shown, the system controller computer and the image processing computer may be connected to a workstation.

The load port loads a wafer to the wafer transfer system, such as EREM 130, and the wafer transfer system controller controls the wafer transfer to transfer the wafer to the load/lock, such as load lock 150. The load/lock controller controls the load/lock to the chamber, such that an object that is to be examiner, e.g. a wafer can be fixed on a clamp, e.g. an electrostatic clamp, also referred to as an e-chuck. The positioning device, e.g. the z-stage and the xy-stage, enable the wafer to move by the stage controller. In an embodiment, a height of the z-stage may e.g. be adjusted using a piezo component such as a piezo actuator. The electron optic controller may control all the conditions of the electron optics system, and the detector controller may receive and convert the electric signals from the electron optic system to image signals. The system controller computer is to send the commands to the corresponding controller. After receiving the image signals, the image processing computer may process the image signals to identify defects.

Figure 5:
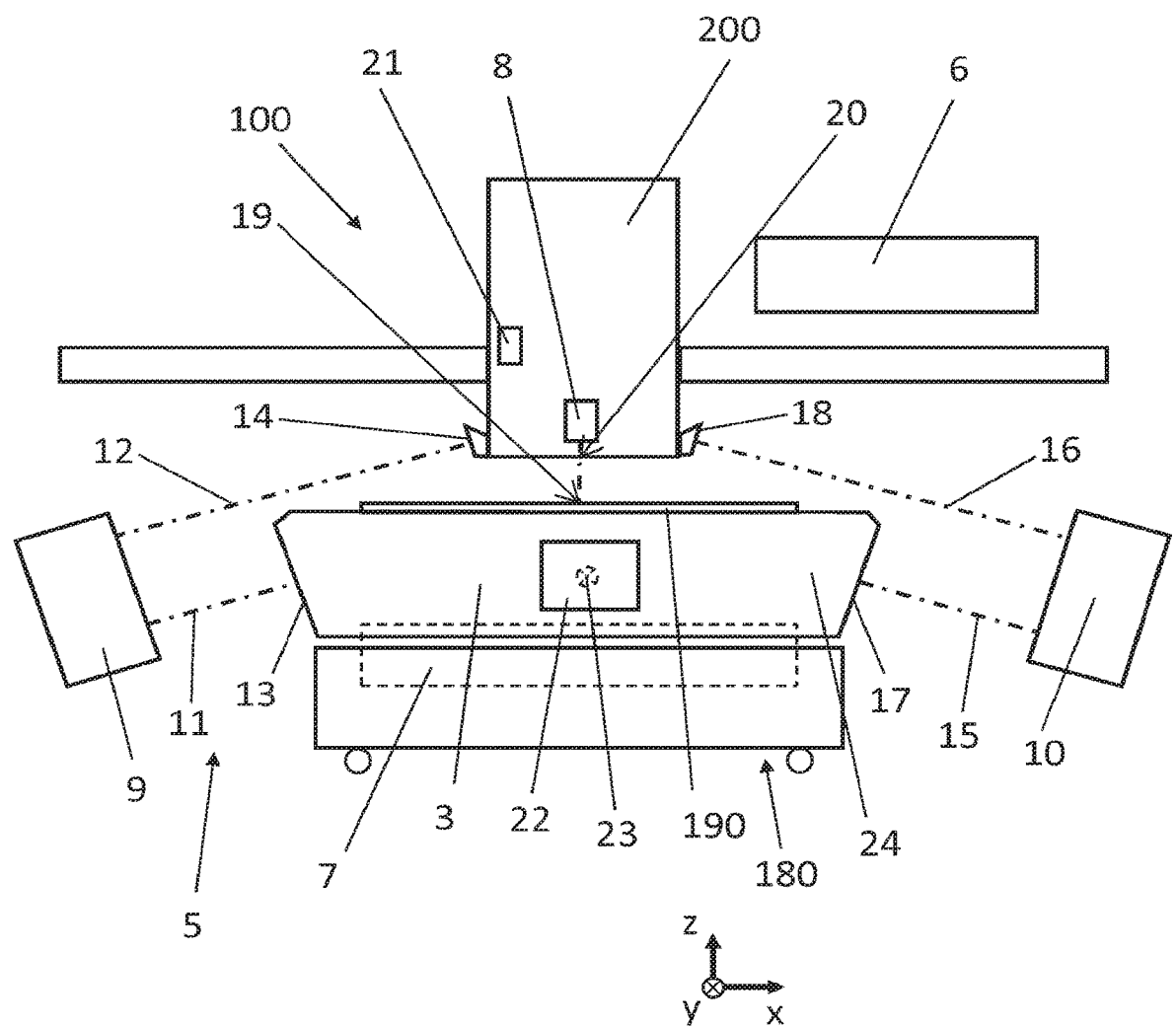
FIG. 5 schematically depicts a first embodiment of an e-beam inspection tool according to some embodiments of the present disclosure.

FIG. 5 schematically depicts a side view of an embodiment of an e-beam inspection tool 100 according to some embodiments of the present disclosure. The e-beam inspection tool 100 comprises an electron optics system 200. The electron optics system 200 comprises an electron gun 210 and an imaging system 240 as described with respect to FIG. 2.

The electron optics system 200 is arranged above a movable object table 3 of a positioning device 180. The object table 3 is arranged to support an object, in particular a substrate 190. The object table 3 is movable in an x-direction, y-direction and z-direction to align a target portion of the substrate 190 with the electron optics system 200 such that an electron beam from the electron optics system 200 can be used to inspect the substrate 190, in particular its upper surface.

To properly align the target portion of the substrate 190 with the electron optics system 200, a position control system is provided that is arranged to control the position of the object table 3 with respect to the electron optics system 200.

The position control system comprises a position measurement system 5, a controller 6 and at least one actuator 7. The position measurement system 5 is arranged to determine a position of the substrate 190 supported on the object table 3 with respect to the electron optics system 200. The position measurement system 5 comprises a first position sensor 8 to measure a height position of the substrate 190. The first position sensor 8 is an optical sensor that is mounted on the electron optics system 200 to directly measure the distance between the electron optics system 200 and the substrate 190.

Since the first position sensor 8 directly measures the distance between the electron optics system 200 and the target portion of the upper surface of the substrate 190, the first position sensor 8 may determine the vertical position of the target portion of the substrate 190 relative to the electron optics system 200 with high accuracy. However, optical sensors typically used for this direct measurement of the height position of the upper surface of the substrate 190 have a relative low measurement rate, for example a measurement frequency rate of 100-150 Hz.

The position measurement system further comprises a first interferometer sensor 9 and a second interferometer sensor 10.

The first interferometer sensor 9 provides a first measurement beam 11 and a first reference beam 12. The first measurement beam 11 is directed in a first measurement direction to a first reflective surface 13 on the object table 3. The first reference beam 12 is directed in a first reference beam direction to a first reflective reference surface 14 provided on a first reflective element mounted on the electron optics system 200. The first measurement direction and the first reference beam direction are parallel to each other. This makes position measurements by the first interferometer sensor 9 insensitive to a displacement of the first interferometer sensor 9. Since the first reference beam 12 is directed to the first reflective reference surface 14, the first interferometer sensor 9 directly measures, in the first measurement direction, a relative displacement between the electron optics system 200 and the object table 3.

Correspondingly, the second interferometer sensor 10 provides a second measurement beam 15 and a second reference beam 16. The second measurement beam 15 is directed in a second measurement direction to a second reflective surface 17 on the object table 3. The second reference beam 16 is directed in a second reference beam direction to a second reflective reference surface 18 provided on a second reflective element mounted on the electron optics system 200. The second measurement direction and the second reference beam direction are parallel to each other. This makes position measurements by the second interferometer sensor 10 insensitive to a displacement of the second interferometer sensor 10. Since the second reference beam 16 is directed to the second reflective reference surface 18, the second interferometer sensor 10 directly measures a relative displacement between the electron optics system 200 and the object table 3.

The first reflective surface 13 and the second reflective surface 17 may be arranged in opposite sides of the object table, preferably opposite sides of the object table with respect to the vertical axis (also further indicated as first axis) of the object table 3.

In the embodiment of FIG. 5, side surfaces of the object table 3 are used as the first reflective surface 13 and the second reflective surface 17. In alternative embodiments, the first reflective surface and/or second reflective surface may be provided on a reflective surface element mounted on the object table 3.

The first reflective reference surface 14 and the second reflective reference surface 18 may be provided on any suitable location which is stiffly connected to the electron optics system 200, in particular the electron gun 210. The location may be the electron gun 210, the imaging system 240, for example a housing or frame thereof. The first reflective reference surface 14 and the second reflective reference surface 18 may be provided directly at this location or may be provided on separate reflective elements mounted on the respective location, as shown in FIG. 5.

In the shown embodiment, the first measurement direction comprises a horizontal component (in the x-direction indicated in FIG. 5) and a vertical component (in the z-direction indicated in FIG. 5). Correspondingly, the second measurement direction comprises a horizontal component (in the x-direction indicated in FIG. 5) and a vertical component (in the z-direction indicated in FIG. 5). The horizontal components of the first measurement direction and the second measurement direction are opposite to each other, i.e. a positive x-direction and a negative x-direction. The vertical components of the first measurement direction and the second measurement direction both extend upwards.

By calculating predefined or calibrated linear combinations of interferometer measurements of the first interferometer sensor 9 and the second interferometer sensor 10, the displacements of the object table 3 in x- and z-direction may be determined. In the embodiment shown in FIG. 5, displacement in the x-direction is proportional to the difference of interferometer measurements of the first interferometer sensor 9 and the second interferometer sensor 10, while the z displacement is proportional to the sum of interferometer measurements of the first interferometer sensor 9 and the second interferometer sensor 10. The x displacement measurement in this embodiment is not affected by some common measurement errors between the first interferometer sensor 9 and the second interferometer sensor 10 such as a measurement error due to a homogeneous expansion of the electron optics system 200 in x-direction.

The first reference beam 12 and the second reference beam 16 may be arranged to have equal lengths. This makes the x displacement measurement in this embodiment insensitive to displacements of the reflective reference surfaces 14, 18 with an equal magnitude and the opposite signs such as a homogeneous expansion of the electron optics system 200 in x-direction.

An angle between the first measurement direction and the horizontal component of the first measurement direction may for example be in the range of 2-20 degrees, for instance 5 degrees. An angle between the second measurement direction and the horizontal component of the second measurement direction may also be in the range of 2-20 degrees, for instance 5 degrees. Preferably, these angles are the same. The first reflective surface 13, the first reflective reference surface 14, the second reflective surface 17, and the second reflective reference surface 18 are arranged perpendicular to the first measurement direction, first reference beam direction, second measurement direction and second reference beam direction, respectively.

It is remarked that movement of the object table 3 in the x-direction, y-direction and/or z-direction will result in the first measurement beam 11 being reflected at another location within a measurement range of the first reflective surface 13 and the second measurement beam 15 being reflected at another location of a measurement range of the second reflective surface 17. The measurement ranges of the first reflective surface 13 and the second reflective surface 17 may be rectangular and have a substantial dimension.

Dependent on the location at which the first measurement beam 11 is reflected on the first reflective surface 13, the reflection behavior may differ. In order to take this difference in reflection behavior between different locations within the measurement range of the first reflective surface 13 into account, the position measurement system 5 and/or the controller 6 may comprise a correction map for the first reflective surface 13 to correct for differences in reflective behavior of different locations of the first reflective surface 13. Similarly, the position measurement system 5 and/or the controller 6 may comprise a correction map for the second reflective surface 17 to correct for differences in reflective behavior of different locations of the second reflective surface 17. Also, correction maps may be provided for the combination of the first reflective surface 13 and the second reflective surface 17.

The first measurement direction of the first measurement beam 11 and the second measurement direction of the second measurement beam 15 intersect at the target location 19 on the substrate 190. When the target portion is correctly positioned with respect to the electron optics system 200, this location is also the crossover location, i.e. a point where the electron beam is focused. This enables an accurate determination of the x-position of the target location 19 without the need for correction of different orientations of the object table 3 caused by rotation of the object table 3 about a rotation axis in the y-direction. A person skilled in the art will refer to this measurement as 'a measurement in Abbe' or 'a measurement with a small Abbe arm'.

However, the first reference beam direction and the second reference beam direction intersect at a location above the location of interest 20 of the electron optics system 200. It is therefore desirable that any rotation of the electron optics system 200 about an axis in x-direction and/or y-direction is compensated to prevent an Abbe error in the measurement of the first interferometer sensor 9 and the second interferometer sensor 10. An acceleration sensor 21 is mounted on the electron optics system 200 to measure accelerations of the electron optics system 200. On the basis of these measured accelerations, rotations of the electron optics system 200 may be detected and compensated. Any other sensor suitable to determine rotations of the electron optics system 200 may also be applied.

A third interferometer sensor 22 is provided to determine with a third measurement beam 23 a position of the object table 3 in a third measurement direction, perpendicular to the x-direction and the z-direction, i.e. the y-direction. The third measurement beam 23 is reflected on a third reflective surface 24 on the object table 3. The third reflective surface 24 extends in the x-z plane, i.e. perpendicular to the y-direction. The third interferometer sensor 22 is arranged at a distance from the object table 3 to allow movement of the object table 3 in the y-direction. The third interferometer sensor 22 may be mounted on any suitable support, for example a vibration isolated support frame.

It is remarked that a reference beam of the third interferometer sensor 22 may be directed to and reflected on a third reflective reference surface on the electron optics system 200 so that the third interferometer sensor 22 directly measures the relative displacement between the object table 3 and the electron optics system 200.

The first interferometer sensor 9, the second interferometer sensor 10 and the third interferometer sensor 22 provide sufficient measurement data to determine a position of the object table 3 in three degrees of freedom, i.e. the x-direction, y-direction and the z-direction. When desired further interferometer sensors or other sensor devices may be provided to measure rotation of the object table 3 about an axis extending in the x-direction, y-direction and/or z-direction. Preferably, the position measurement system 5 comprises at least six interferometer sensors to determine a position and rotation of the object table 3 in all six degrees of freedom.

The interferometer sensors 9, 10, 22 can determine the position of the object table 3 with a relatively fast measurement rate compared with a measurement rate of the first position sensor 8 used to directly measure a height level of a substrate 190 supported on the object table 3. But the interferometer sensors 9, 10 measure the height position of the substrate 190 on the object table 3 indirectly, i.e. the interferometer sensors 9, 10 measure a relative height displacement of the object table 3 and on the basis of this measurement a height position of the substrate is calculated. However, certain local characteristics of the substrate 190, such as height differences due to thickness or unflatness of the substrate 190, cannot be measured by the interferometer sensors 9, 10, and will therefore not be taken into account when the height position of the substrate 180 is only determined on the basis of the measurement of the interferometer sensors 9, 10. However, since the first position sensor 8 directly measures the height of the upper surface of the substrate 190, these local characteristics of the substrate 190 are taken into account in the measurements of the first position sensor 8.

Therefore, in accordance with the present disclosure, the measurement results of both the first position sensor 8 and the interferometer sensors 9, 10, 22 are used in the position control system in order to properly align the substrate 190 supported on the object table 3 with respect to the electron optics system 200.

Figure 6:
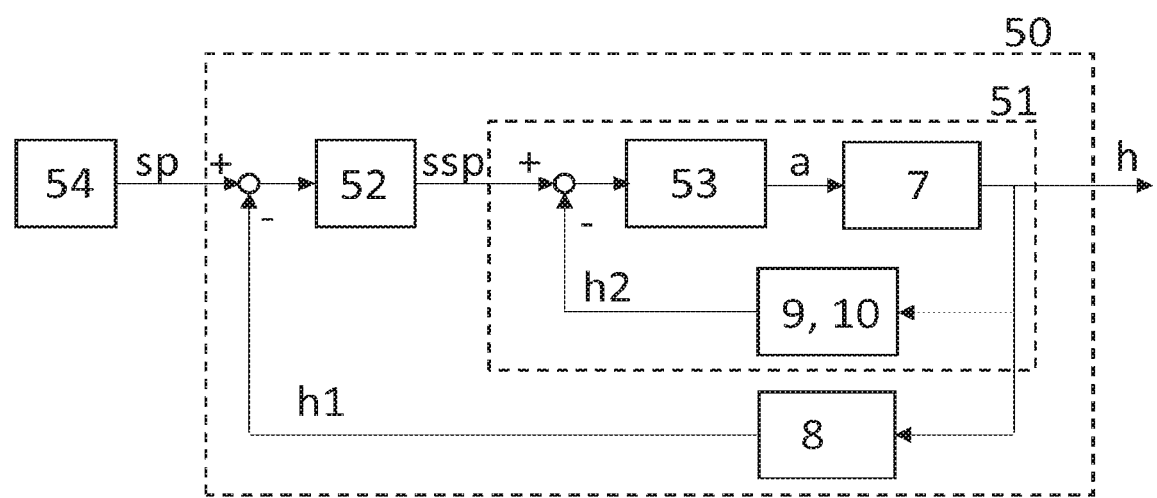
FIG. 6 schematically depicts a control scheme to control the height of a substrate supported on the object table according to some embodiments of the present disclosure.

FIG. 6 shows a control scheme for controlling the position of a target portion of the substrate 190 with respect to the electron optics system 200, such that the electron beam emitted by the electron optics system 200 can be focused on the upper surface of the substrate 190 to inspect the substrate 190. The control scheme comprises a master control loop 50 and a slave control loop 51. The controller 6 comprises a master controller 52 arranged in the master control loop 50 and a slave controller 53 arranged in the slave control loop 51.

A set-point generator 54 provides a set-point sp for the height position of the substrate 190, i.e. a desired height position of the substrate 190, in particular a target portion thereof, with respect to the electron optics system 200. The set-point sp is compared with the height position h1 as measured by the first position sensor 8. On the basis of this comparison the master controller 52 provides a slave set-point signal ssp as input signal for the slave control loop 51. In the slave control loop 51 the slave set-point signal ssp is compared with the vertical position of the substrate 190 determined on the basis of the measurements of the first interferometer sensor 9 and the second interferometer sensor 10.

The slave controller 53 provides an actuation signal a that is used to actuate the at least one actuator 7 to move the object table 3 to a desired height position h.

Thus, in the slave control loop 51, the relatively fast measurement of the height position of the object table 3 is used to control the height position h of the substrate 190. Due to the fast measurement rate of the first and second interferometer sensors 9, 10, the bandwidth of the slave control loop is high, for example >300 Hz.

Simultaneously, the direct but less fast measurements of the first position sensor 8 are used in the master controller 52 to update the slave set-point ssp that is used as input for the slave control loop 51.

It has been found that the master-slave configuration as shown in FIG. 6 provides an advantageous way of controlling the height position of the substrate 190 with respect to the electron optics system 200, in which the characteristics of both the first position sensor 8 and the first and second interferometer sensors 9, 10 are advantageously used.

Figure 7:
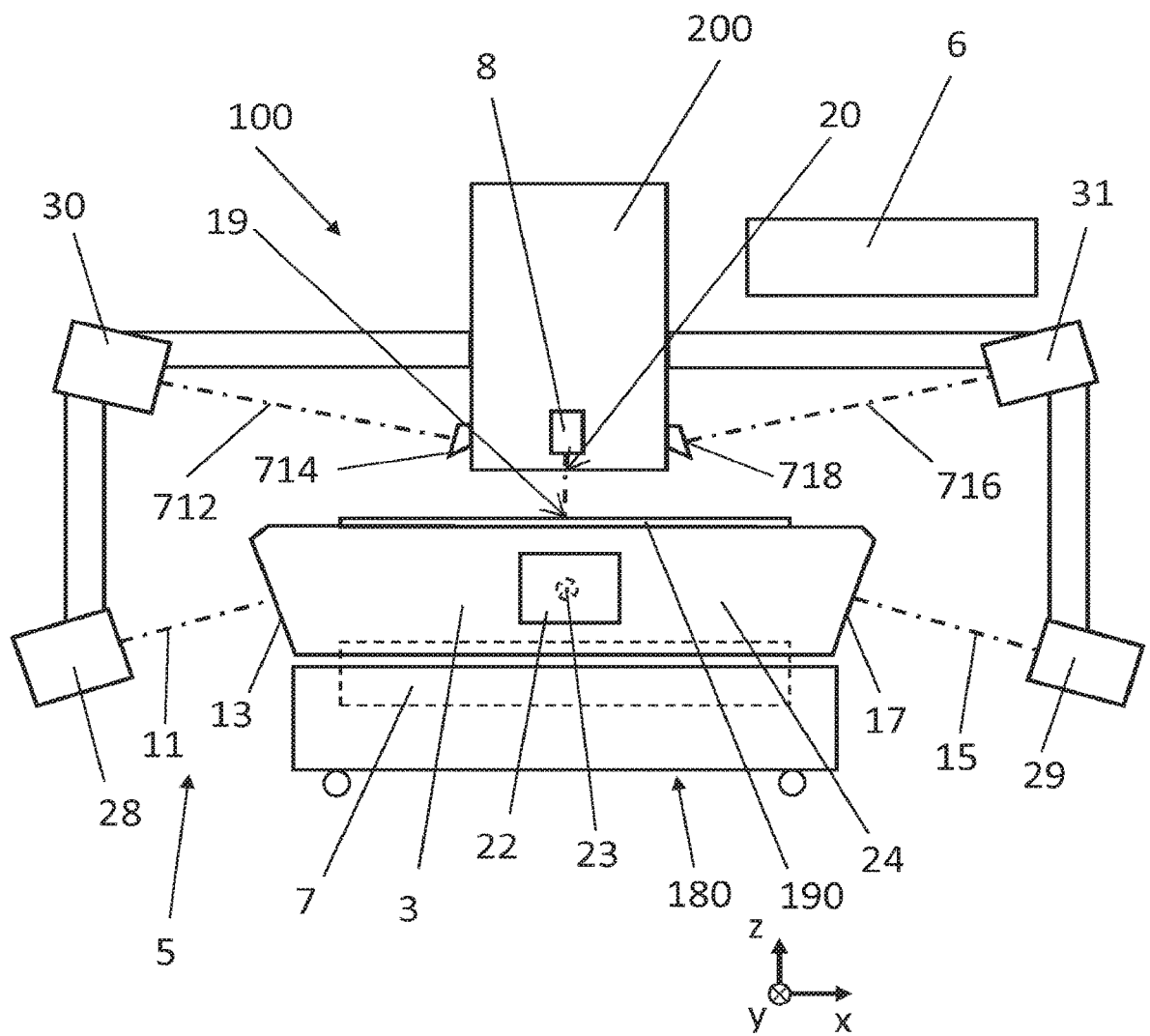
FIG. 7 schematically depicts a second embodiment of an e-beam inspection tool according to some embodiments of the present disclosure.

FIG. 7 shows an alternative embodiment of a position measurement system 5, in particular in the configuration of the interferometer sensors. The position measurement system 5 comprises a first interferometer sensor 28 and a second interferometer sensor 29. The first interferometer sensor 28 provides a first measurement beam 11 to measure a relative displacement between the first reflective surface 13 and the first interferometer sensor 28. Correspondingly, the second interferometer sensor 29 provides a second measurement beam 15 to measure a relative displacement between the second reflective surface 17 and the second interferometer sensor 29. In the position measurement system 5 shown in FIG. 7, the reflective references surfaces of the first interferometer sensor 28 and the second interferometer sensor 29 are integrated in the first interferometer sensor 28 and the second interferometer sensor 29, respectively. As a result, the first interferometer sensor 28 and the second interferometer sensor 29 do not directly measure a relative displacement between the object table 3 and the electron optics system 200, but between the object table and the respective first interferometer sensor 28 or second interferometer sensor 29.

To determine the position of the electron optics system 200 a first additional interferometer sensor 30 and a second additional interferometer sensor 31 are provided. The first additional interferometer sensor 30 provides a first additional measurement beam 712 directed perpendicular to the first reflective reference surface 714 of the electron optics system 200. The second additional interferometer sensor 31 provides a second additional measurement beam 716 directed perpendicular to the second reflective reference surface 718 of the electron optics system 200. The first interferometer sensor 28, the second interferometer sensor 29, the first additional interferometer sensor 30 and the second additional interferometer sensor 31 are preferably mounted on the same frame such that the relative positions of the interferometer sensors 28, 29, 30, 31 remain the same.

The combination of the first interferometer sensor 28, the second interferometer sensor 29, the first additional interferometer sensor 30 and the second additional interferometer sensor 31 enables the position measurement system 5 to determine, in x-direction and z-direction, a position of the object table 3 with respect to the electron optics system 200. This measured position can be used in the slave control loop 51 as shown in FIG. 6.

The first additional measurement beam 712 and the second additional measurement beam 716 may be arranged to have substantially equal lengths. This makes the x displacement measurement in this embodiment insensitive to displacements of the reflective reference surfaces 714, 718 with an equal magnitude and the opposite signs such as a homogeneous expansion of the electron optics system 200 in x-direction.

An important advantage of the embodiment of FIG. 7 is that measurement directions of the first additional measurement beam 712 and the second additional measurement beam 716 intersect at the location of interest 20 of the electron optics system 200. As a result, the position measurement may not need a compensation of an Abbe error as described above with respect to the embodiment of FIG. 5. However, the position measurement system 5 needs additional interferometer sensors 30, 31 to measure a position of the electron optics system 200.

Figure 8:
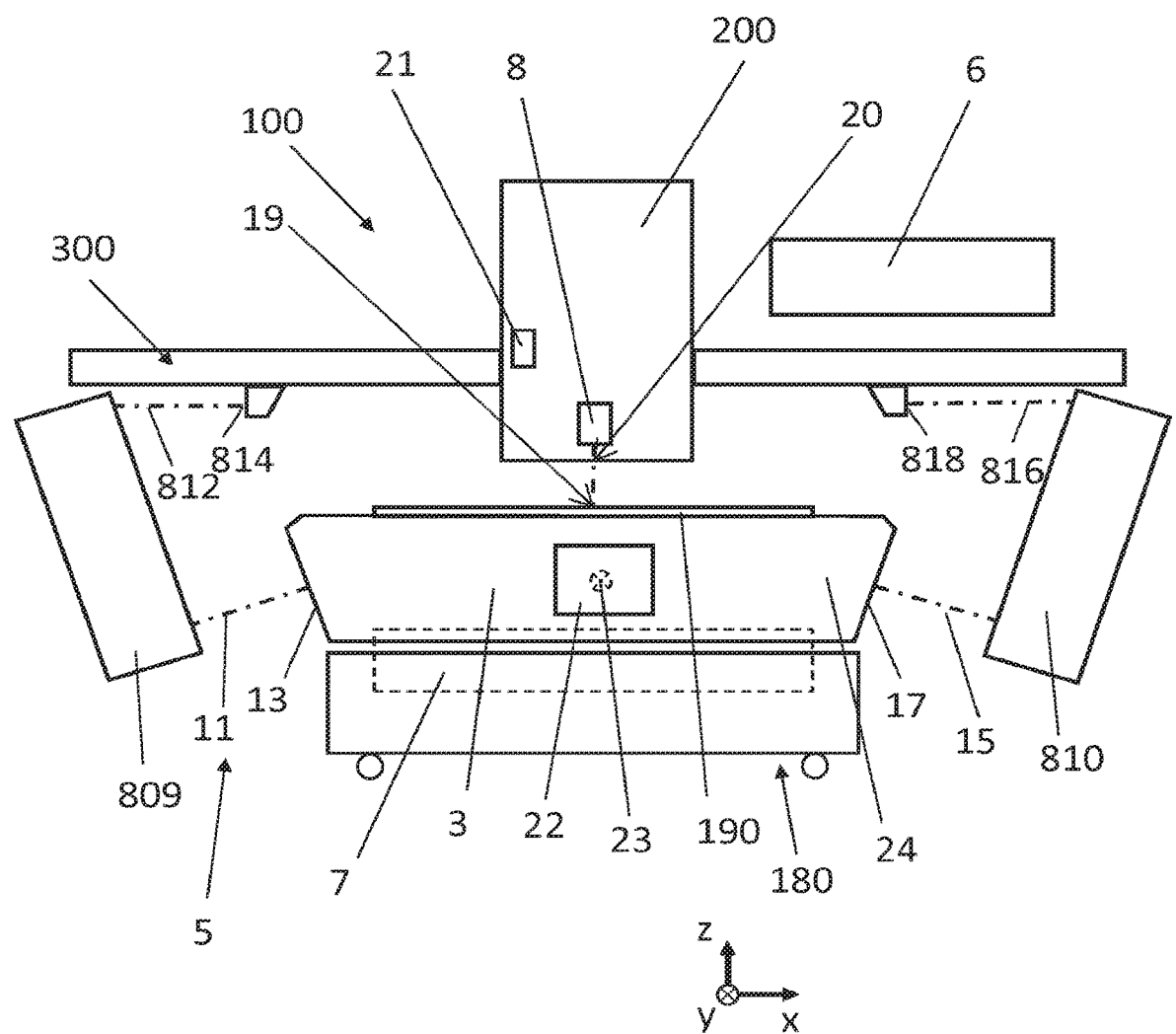
FIG. 8 schematically depicts a third embodiment of an e-beam inspection tool according to some embodiments of the present disclosure.

FIG. 8 shows another alternative embodiment of the position measurement system 5, in particular in the configuration of the interferometer sensors. The first interferometer sensor 809 provides a first measurement beam 11 and a first reference beam 812. The first measurement beam 11 is directed in a first measurement direction to a first reflective surface 13 on the object table 3. The first reference beam 812 is directed in a first reference beam direction, which is preferably parallel to the horizontal plane, to a first reflective reference surface 814 provided on a first reflective element mounted on the metrology frame 300.

The second interferometer sensor 810 provides a second measurement beam 15 and a second reference beam 816. The second measurement beam 15 is directed in a second measurement direction to a second reflective surface 17 on the object table 3. The second reference beam 816 is directed in a second reference beam direction, which is preferably parallel to the horizontal plane, to a second reflective reference surface 818 provided on a second reflective element mounted on the metrology frame 300.

The first reference beam 812 and the second reference beam 816 may be arranged to have substantially equal lengths. This makes the x displacement measurement in this embodiment insensitive to displacements of the reflective reference surfaces 814, 818 with an equal magnitude and the opposite signs such as a homogeneous expansion of the reference beam 300 in x-direction.

Figure 9:
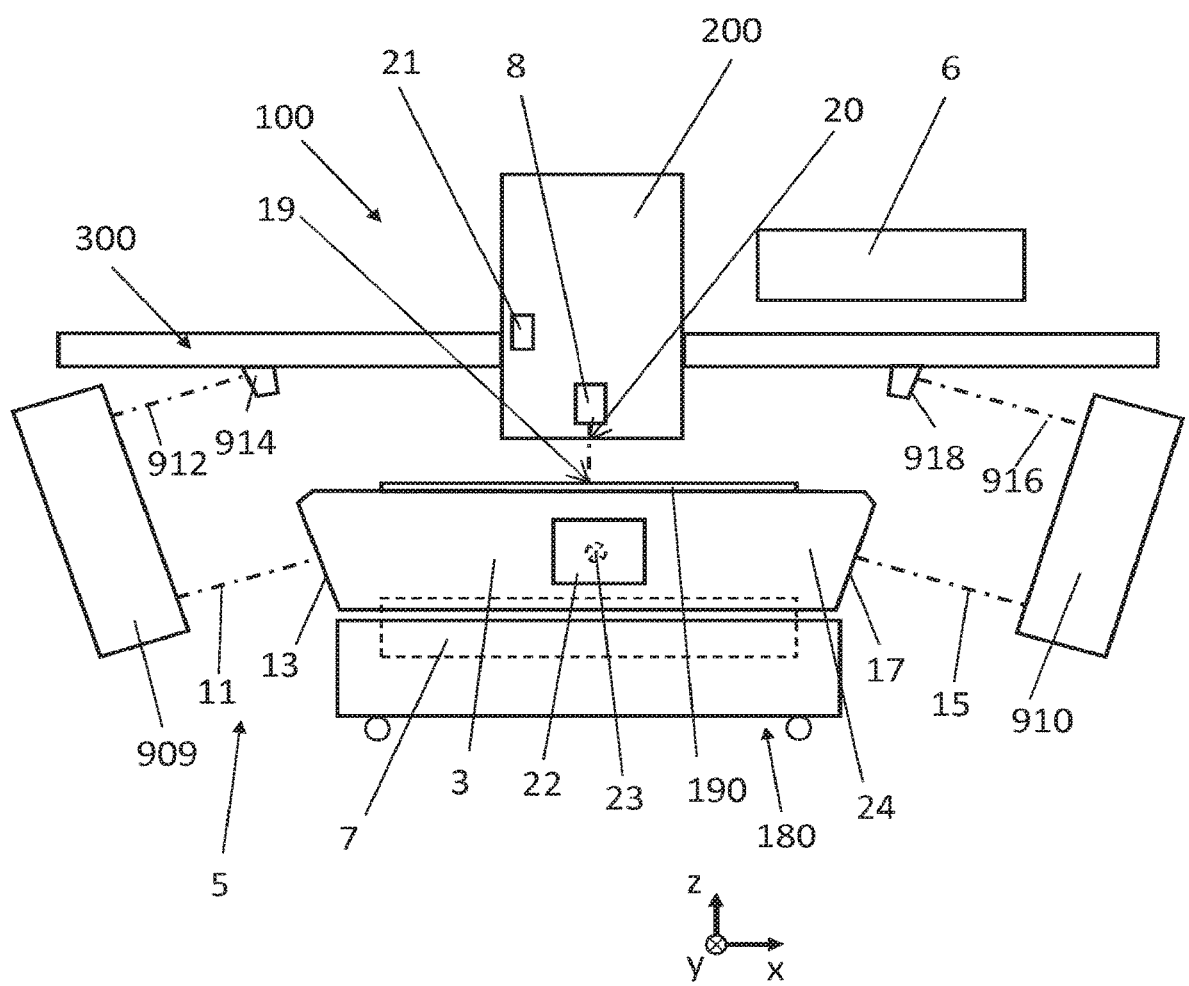
FIG. 9 schematically depicts a fourth embodiment of an e-beam inspection tool according to some embodiments of the present disclosure.

FIG. 9 shows yet another alternative embodiment of the position measurement system 5, in particular in the configuration of the interferometer sensors. The first interferometer sensor 909 provides a first measurement beam 11 and a first reference beam 912. The first measurement beam 11 is directed in a first measurement direction to a first reflective surface 13 on the object table 3. The first reference beam 912 is directed in a first reference beam direction to a first reflective reference surface 914 provided on a first reflective element mounted on the metrology frame 300. The first measurement direction and the first reference beam direction are parallel to each other. This makes position measurements by the first interferometer sensor 9 insensitive to a displacement of the first interferometer sensor 9.

The second interferometer sensor 910 provides a second measurement beam 15 and a second reference beam 916. The second measurement beam 15 is directed in a second measurement direction to a second reflective surface 17 on the object table 3. The second reference beam 916 is directed in a second reference beam direction to a second reflective reference surface 918 provided on a second reflective element mounted on the metrology frame 300. The second measurement direction and the second reference beam direction are parallel to each other. This makes position measurements by the second interferometer sensor 910 insensitive to a displacement of the second interferometer sensor 910.

The first reference beam 912 and the second reference beam 916 may be arranged to have substantially equal lengths. This makes the x displacement measurement in this embodiment insensitive to displacements of the reflective reference surfaces 914, 918 with an equal magnitude and the opposite signs such as a homogeneous expansion of the reference beam 300 in x-direction.

It is remarked that in yet another alternative embodiment the first and second interferometer sensors may be arranged at a higher height level than the first reflective surfaces and the second reflective surface, such that the first and second measurement beam have a vertical downwards component, similar to the first and second additional interferometer sensor 30, 31 of FIG. 7. In such embodiment, the reference beams of the first and second interferometer sensors may be directed to and reflected on first and second reflective reference surfaces on the electron optics system 200 to directly measure a relative displacement between the object table 3 and the electron optics system 200. Alternatively, additional interferometer sensors may be provided to measure a relative displacement of the electron optics system 200 with respect to a first reference frame on which the first interferometer sensor and the first additional interferometer are mounted and a second reference frame on which the second interferometer sensor and the second additional interferometer are mounted.

Further embodiments may be described in the following clauses:

1. A stage apparatus comprising:
    an object table comprising an supporting surface, the object table configured to support a substrate on the supporting surface;
    a positioning device configured to position the object table;
    a position measurement system comprising a position sensor configured to measure a height position of the object table parallel an first axis, the first axis being substantially perpendicular to the supporting surface, the position sensor comprising an interferometer measurement system having an interferometer sensor,
    wherein a measurement beam of the interferometer sensor is configured to irradiate a reflective surface of the object table in a measurement direction, the measurement direction having a first component parallel to the first axis and a second component parallel to a second axis, the second axis being substantially perpendicular to the first axis.
2. The stage apparatus according to clause 1, the position measurement system further comprising:
    a second position sensor configured to measure a further height position of the substrate parallel to the first axis.
3. The stage apparatus according to clause 2, the second position sensor being configured to measure the further height position directly on the substrate.
4. The stage apparatus according to clause 2 or 3, wherein the stage apparatus is configured to measure the further height position of the substrate using the second position sensor at a lower measuring rate compared to a measuring rate of the position sensor.
5. The stage apparatus according to any of clause 2 to 4, wherein the stage apparatus is configured to measure the further height position of the substrate using the second position sensor at a higher measuring accuracy compared to a measuring accuracy of the position sensor.
6. The stage apparatus according to any of clause 2 to 5, further comprising:
    a controller to provide an actuation signal; and
    at least one actuator configured to adjust the height position of the object table on the basis of the actuation signal,
    wherein the controller comprises a master-slave configuration having a master control loop and a slave control loop, wherein in use, in the slave control loop, the position sensor is used to control the further height position of the substrate, and wherein in use, in the master control loop, the second position sensor is used to provide a set-point for the slave control loop.
7. The stage apparatus according to any of clause 1 to 6, wherein the reflective surface is arranged substantially perpendicular to the measurement direction of the interferometer sensor.
8. The stage apparatus according to any of clause 1 to 7, wherein the measurement direction and a reference beam direction of a reference beam of the interferometer sensor are substantially parallel to each other.
9. The stage apparatus according to any of clause 1 to 8, wherein a side surface of the object table being a surface of the object table not supporting the substrate is configured to form the reflective surface of the object table, or wherein a reflective surface element mounted on the side surface of the object table is configured to form the reflective surface of the object table.
10. The stage apparatus according to any of clause 1 to 9, wherein the position measurement system and/or the controller comprise a correction map of the reflective surface of the object table configured to correct for differences in reflective behaviors at different locations of the reflective surface of the object table.
11. The stage apparatus according to any of clause 1 to 10, wherein the first component of the measurement direction is directed to a first direction from the object table to the substrate parallel to the first axis, or wherein the first component of the measurement direction is directed to a second direction from the substrate to the object table parallel to the first axis.
12. The stage apparatus according to any of clause 1 to 11, wherein an angle between the measurement direction and the second axis is between 2 and 20 degrees.
13. The stage apparatus according to any of clause 1 to 12, where in the reference beam is substantially parallel to the second axis.
14. The stage apparatus according to any of clause 1 to 13, wherein the interferometer measurement system comprises a second interferometer sensor, wherein a second measurement beam of the second interferometer sensor is directed in a second measurement direction to a second reflective surface of the object table, the second measurement direction having a third component parallel to the first axis and a fourth component parallel to a third axis, the third axis being substantially perpendicular to the first axis.
15. The stage apparatus according to clause 14, wherein the reflective surface and the second reflective surface are arranged at opposite sides of the object table.
16. The stage apparatus according to clause 15, wherein the reflective surface and the second reflective surface are arranged at opposite sides of the object table with respect to the first axis.
17. The stage apparatus according to any of clause 14 to 16, wherein the reference beam and a second reference beam of the second interferometer sensor have a substantially equal length.
18. The stage apparatus according to any of clause 14 to 17, wherein the third axis is the second axis.
19. The stage apparatus according to any of clause 14 to 18, wherein the first component of the measurement direction and the third component of the second measurement direction have a same direction, and wherein the second component of the measurement direction and the fourth component of the second measurement direction have opposite directions.
20. The stage apparatus according to any of clause 14 to 19, wherein the measurement direction of the measurement beam and the second measurement direction of the second measurement beam intersect at a target position on the substrate.
21. The stage apparatus according to any of clause 14 to 20, wherein the position measurement system comprises a third interferometer sensor, wherein a third measurement beam of the third interferometer sensor is directed in a third measurement direction to a third reflective surface of the object table, the third measurement direction only having a fifth component parallel to a fourth axis, the fourth axis being perpendicular to the first axis and the third axis.
22. The stage apparatus according to any of clause 2 to 21, wherein the second position sensor is an optical sensor.

23. The stage apparatus according to any of clause 1 to 22, wherein the position measurement system is configured to determine a position of the object table in six degrees of freedom.
24. A particle beam apparatus comprising:
a particle beam generator configured to provide a particle beam to a substrate; and
the stage apparatus according to any of clause 1 to 23.
25. The particle beam apparatus according to clause 24, wherein a reflective reference surface of the interferometer sensor configured to be irradiated by the reference beam is arranged on the particle beam generator.
26. The particle beam apparatus according to clause 24, wherein the reflective reference surface is arranged on a frame supporting the particle beam generator.
27. The particle beam apparatus according to any of clause 24 to 26,
wherein the reference beam direction and a second reference beam direction of the second reference beam intersect at a second target position on the particle beam generator.
28. The particle beam apparatus according to any of clause 24 to 27,
wherein the optical sensor is mounted on the particle beam generator or the frame supporting the particle beam generator.
29. The particle beam apparatus according to any of clause 24 to 28,
wherein the particle beam apparatus is an e-beam apparatus and the particle beam is an electron beam.
30. The e-beam apparatus according to clause 29, wherein the e-beam apparatus is an e-beam inspection apparatus.
31. An apparatus comprising the stage apparatus according to any of clause 1 to 23, the particle beam apparatus according to any of clause 24 to 29, or the e-beam apparatus according to clause 30, further comprising a vacuum chamber.
32. An apparatus comprising the stage apparatus according to clause 1 to 23 wherein the apparatus is a lithography apparatus or a metrology apparatus.
33. The apparatus according to clause 32, further comprising a projection optical system,
wherein the reflective reference surface of the interferometer sensor configured to be irradiated by the reference beam is arranged on the projection optical system.
34. The apparatus according to clause 32, further comprising the projection optical system,
wherein the reflective reference surface of the interferometer sensor configured to be irradiated by the reference beam is arranged on a frame supporting the projection optical system.
35. The apparatus according to clause 32 or 34,
wherein the reference beam direction and the second reference beam direction of the second reference beam intersect at a second target position on the projection optical system.
36. The apparatus according to any of clause 32 to 35, wherein the optical sensor is mounted on the projection optical system or the frame supporting the projection optical system.

The above describes the electron beam inspection apparatus according to various embodiments separately. A combination of the various embodiments may however be combined into a single electron beam inspection apparatus.

Although the embodiments described in the specification are mainly related to an e-beam inspection tool or apparatus, the applications of the disclosed embodiments may not be limited to these particular embodiments. The disclosed embodiments may be applied not only to the e-beam inspection tools but to any other kinds of e-beam tools such as CD-SEM, EBDW (E-Beam Direct Writer), EPL (E-beam Projection Lithography, and E-beam defect verification tool, any kinds of tools with a vacuum chamber, lithography apparatus, and metrology apparatus.

Although the disclosed embodiments have been explained in relation to its preferred embodiment, it is to be understood that other modifications and variation can be made without departing from the spirit and scope of the invention as hereafter claimed.

What is claimed is:
1. An apparatus comprising:
a beam generator configured to provide a beam on a substrate;
an object table comprising an supporting surface, the object table configured to support the substrate on the supporting surface;
a positioning device configured to position the object table;
a position measurement system comprising a position sensor configured to measure a height position of the object table parallel to a first axis, the first axis being substantially perpendicular to the supporting surface, the position sensor comprising an interferometer measurement system having an interferometer sensor,
wherein a measurement beam of the interferometer sensor is configured to irradiate a reflective surface of the object table in a measurement direction, the measurement direction having a first component parallel to the first axis and a second component parallel to a second axis, the second axis being substantially perpendicular to the first axis and
wherein a reflective reference surface of the interferometer sensor configured to be irradiated by a reference beam of the interferometer sensor is arranged on the beam generator or is arranged on a frame supporting the beam generator.
2. The apparatus according to claim 1, the position measurement system further comprising:
a second position sensor configured to measure a further height position of the substrate parallel to the first axis;
a controller to provide an actuation signal; and
at least one actuator configured to adjust the height position of the object table at least partially based on the actuation signal,
wherein the apparatus is configured to measure the further height position of the substrate using the second position sensor at a lower measuring rate compared to a measuring rate of the position sensor, and
wherein the controller comprises a master-slave configuration having a master control loop and a slave control loop, wherein in use, in the slave control loop, the position sensor is used to control the further height position of the substrate, and wherein in use, in the master control loop, the second position sensor is used to provide a set-point for the slave control loop.
3. The apparatus according to claim 1, wherein the reflective surface is arranged substantially perpendicular to the measurement direction of the interferometer sensor.
4. The apparatus according to claim 1, wherein an angle between the measurement direction and the second axis is between 2 and 20 degrees.

5. The apparatus according to claim 1, wherein a reference beam direction of the reference beam is substantially parallel to the measurement beam or is substantially parallel to the second axis.

6. The apparatus according to claim 1, wherein a side surface of the object table being a surface of the object table not supporting the substrate is configured to form the reflective surface of the object table, or wherein a reflective surface element mounted on the side surface of the object table is configured to form the reflective surface of the object table.

7. The apparatus according to claim 1, wherein the position measurement system and/or the controller comprise a correction map of the reflective surface of the object table configured to correct for differences in reflective behaviors at different locations of the reflective surface of the object table.

8. The apparatus according to claim 1, wherein the interferometer measurement system comprises a second interferometer sensor, wherein a second measurement beam of the second interferometer sensor is directed in a second measurement direction to a second reflective surface of the object table, the second measurement direction having a third component parallel to the first axis and a fourth component parallel to a third axis, the third axis being substantially perpendicular to the first axis.

9. The apparatus according to claim 8, wherein the position sensor is configured to measure a position of the object table parallel to the second axis.

10. The apparatus according to claim 8, wherein the position sensor is configured to measure a position of the object table in 3 degrees of freedom or 6 degrees of freedom.

11. The apparatus according to claim 8,
wherein the reflective surface and the second reflective surface are arranged at opposite sides of the object table with respect to the first axis, and
wherein the first component of the measurement direction and the third component of the second measurement direction have a same direction, and the second component of the measurement direction and the fourth component of the second measurement direction have opposite directions.

12. The apparatus according to claim 8, wherein the reference beam and a second reference beam of the second interferometer sensor have a substantially equal length.

13. The apparatus according to claim 8, wherein the measurement direction of the measurement beam and the second measurement direction of the second measurement beam intersect at a target position on the substrate.

14. The apparatus according to claim 8, wherein the reference beam direction and a second reference beam direction of the second reference beam intersect at a second target position on the beam generator.

15. The apparatus according to claim 1, wherein the apparatus is a particle beam apparatus, an e-beam apparatus, an e-beam inspection apparatus, a lithography apparatus, a metrology apparatus, or a vacuum apparatus.

16. The apparatus according to claim 1, wherein the apparatus is a particle beam apparatus and the beam generator is a particle beam generator.

17. The apparatus according to claim 1, wherein the apparatus is an e-beam apparatus and the beam generator is an e-beam generator.

18. The apparatus according to claim 1, wherein the apparatus is an e-beam inspection apparatus and the beam generator is an e-beam generator.

19. The apparatus according to claim 1, wherein the apparatus is a lithography apparatus and the beam generator is a projection optical system.

20. The apparatus according to claim 17, wherein the e-beam apparatus is one of CD-SEM, EBDW (E-Beam Direct Writer), EPL (E-beam Projection Lithography, and E-beam defect verification tool.

* * * * *